United States Patent
Wu et al.

(10) Patent No.: US 9,899,258 B1
(45) Date of Patent: Feb. 20, 2018

(54) METAL LINER OVERHANG REDUCTION AND MANUFACTURING METHOD THEREOF

(71) Applicant: Taiwan Semiconductor Manufacturing Company, Ltd., Hsin-Chu (TW)

(72) Inventors: Pei-Wen Wu, Xinfeng Township (TW); Sung-Li Wang, Zhubei (TW); Min-Hsiu Hung, Tainan (TW); Yida Li, Hsin-Chu (TW); Chih-Wei Chang, Hsin-Chu (TW); Huang-Yi Huang, Hsin-chu (TW); Cheng-Tung Lin, Jhudong Township (TW); Jyh-Cherng Sheu, Hsin-Chu (TW); Yee-Chia Yeo, Hsin-Chu (TW); Chi On Chui, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/282,440

(22) Filed: Sep. 30, 2016

(51) Int. Cl.
*H01L 21/768* (2006.01)
*H01L 21/3213* (2006.01)

(52) U.S. Cl.
CPC .. *H01L 21/76879* (2013.01); *H01L 21/76847* (2013.01); *H01L 21/76865* (2013.01); *H01L 21/76871* (2013.01); *H01L 21/76883* (2013.01)

(58) Field of Classification Search
CPC ......... H01L 21/76879; H01L 21/76883; H01L 21/76838; H01L 21/7684–21/76841; H01L 21/76843–21/76847; H01L 21/76856; H01L 21/76858;
(Continued)

(56) References Cited

U.S. PATENT DOCUMENTS

| 5,654,233 A * | 8/1997 | Yu | H01L 21/76843 |
| | | | 257/E21.584 |
| 2003/0186524 A1* | 10/2003 | Ryo | H01L 21/76807 |
| | | | 438/597 |

(Continued)

OTHER PUBLICATIONS

A. Buekens et al., "Thermodynamic Behavior of Metal Chlorides and Sulfates under the Conditions of Incineration Furnaces," Environmental Science and Technology, vol. 30, No. 1, 1996, pp. 50-56.
(Continued)

*Primary Examiner* — Marvin Payen
*Assistant Examiner* — Jeremy Joy
(74) *Attorney, Agent, or Firm* — Slater Matsil, LLP

(57) ABSTRACT

Overhang reduction methods are disclosed. In some embodiments, a method includes forming a recess in a dielectric layer, the recess defining first sidewalls of the dielectric layer. The method also includes depositing a first conductive layer over an upper surface of the dielectric layer and the sidewalls of the dielectric layer, the first conductive layer having a first overhang, removing the first overhang of the first conductive layer using an etchant selected from the group consisting of a halide of the first conductive layer, $Cl_2$, $BCl_3$, SPM, $SC_1$, $SC_2$, and combinations thereof, and filling the recess with a second conductive layer.

20 Claims, 12 Drawing Sheets

(58) Field of Classification Search
CPC ......... H01L 21/76864; H01L 21/76865; H01L 21/76874; H01L 21/76871
See application file for complete search history.

(56) References Cited

U.S. PATENT DOCUMENTS

| | | | |
|---|---|---|---|
| 2003/0203615 A1* | 10/2003 | Denning | H01L 21/76805 438/627 |
| 2004/0018722 A1* | 1/2004 | Tarumi | H01L 21/76804 438/638 |
| 2007/0298607 A1* | 12/2007 | Andryushchenko | H01L 21/32115 438/638 |
| 2011/0237076 A1* | 9/2011 | Narushima | C23C 14/14 438/685 |
| 2012/0070982 A1* | 3/2012 | Yu | H01L 21/2855 438/653 |
| 2015/0024592 A1* | 1/2015 | Chandrashekar | H01L 21/67207 438/675 |
| 2015/0255330 A1* | 9/2015 | Lee | H01L 21/76843 438/653 |
| 2015/0348840 A1* | 12/2015 | Bamnolker | H01L 21/28556 438/669 |
| 2016/0276214 A1* | 9/2016 | Fu | H01L 21/76816 |

OTHER PUBLICATIONS

Yang, et al. "Vaporization Characteristics of Heavy Metal Compounds at Elevated Temperatures," Korean J. of Chem. Eng., vol. 11 No. 4, 1994 pp. 232-238.
S. Norasetthekul et al., "Dry Etch Chemistries for TiO2 thin Films," Applied Surface Science, vol. 185, 2001, pp. 27-33.

* cited by examiner

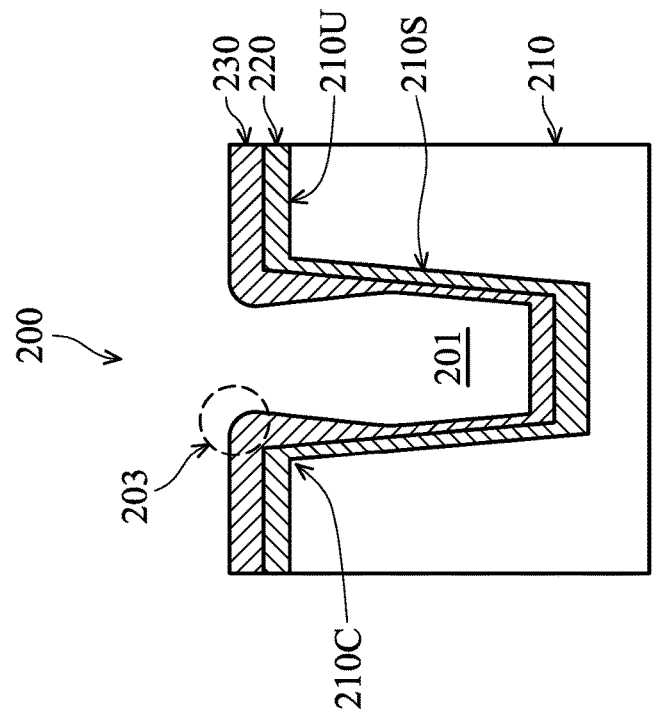
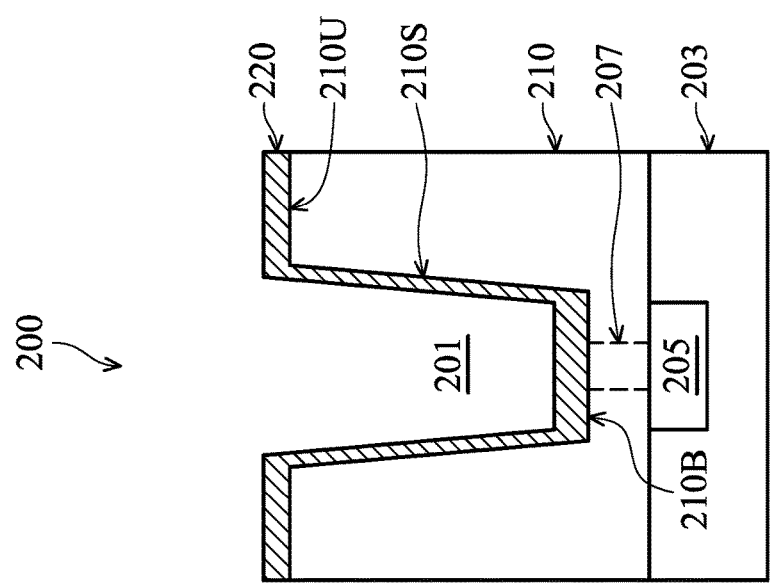

METAL LINER OVERHANG REDUCTION AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

In semiconductor manufacturing, e.g., in middle-of-line (MOL) processing or back-end-of-line (BEOL) processing, conductive materials are used to fill openings or trenches to form conductive features such as contact plugs, vias, or conductive lines. With the scaling down of feature sizes, it has become more difficult to fill small openings or trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2D illustrate cross-sectional views of a semiconductor device at various stages of fabrication, in accordance with some embodiments.

DETAILED DESCRIPTION

Figure 1B:
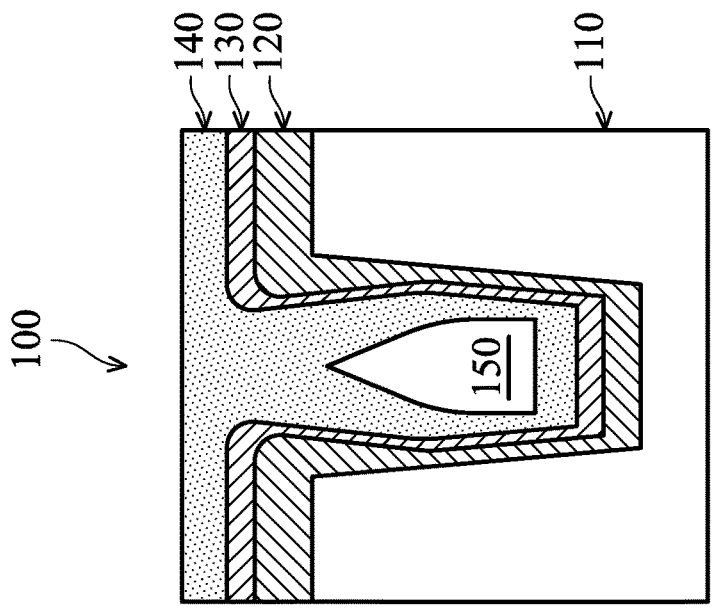
FIGS. 1A and 1B illustrate cross-sectional views of a semiconductor device with an overhang issue at various stages of fabrication.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
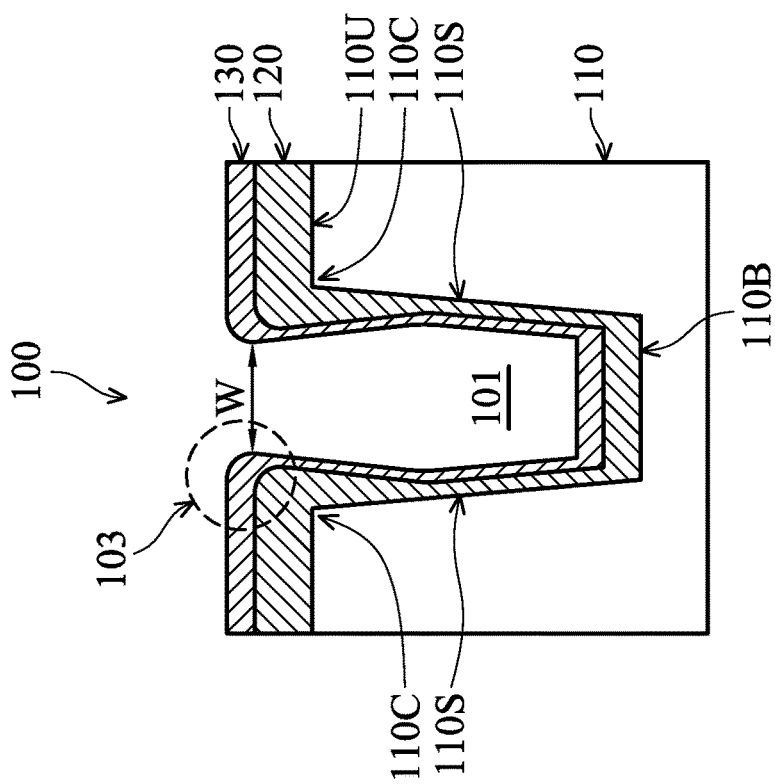

FIGS. 1A and 1B illustrate cross-sectional views of a semiconductor device 100 with an overhang issue at various stages of manufacturing. As shown in FIG. 1, semiconductor device 100 includes a dielectric layer 110 over a substrate (not shown). Dielectric layer 110 may be an inter-layer dielectric (ILD) layer, or an inter-metal dielectric layer (IMD) layer. An opening 101 is formed in dielectric layer 110 extending from an upper surface 110U of dielectric layer 110 into dielectric layer 110. An adhesion layer 120 is formed over upper surface 110U, sidewalls 110S and a bottom surface 110B of dielectric layer 110 exposed by opening 101. Adhesion layer 120 may increase adhesion between dielectric layer 110 and subsequently formed layers (e.g., seed layer 130) over adhesion layer 120, and may be or include a diffusion barrier layer that comprises, e.g., titanium (Ti), titanium nitride (TiN$_x$), tantalum (Ta), tantalum nitride (TaN$_x$), or the like, and may be formed by physical vapor deposition (PVD) or any other suitable deposition method. FIG. 1A also illustrates a seed layer 130 formed over adhesion layer 120. Seed layer 130 may be made of copper and may be formed by physical vapor deposition (PVD), as an example. As shown in FIG. 1A, an overhang 103 of adhesion layer 120 and seed layer 130 is formed proximate a corner region 110C between upper surface 110U and sidewalls 110S of dielectric layer 110. Overhang 103 may protrude from corner region 110C toward opening 101, thus reducing a width W of opening 101 measured proximate upper surface 110U of dielectric layer 110, which makes it difficult to fill opening 101 in subsequent processing.

FIG. 1B illustrates semiconductor device 100 after a conductive layer 140 (e.g., electrically conductive layer comprising copper) is formed over seed layer 130 to form conductive features such as contact plugs, vias, and conductive lines. Due to overhang 103, early pinch-off of metal filling occurs, and conductive layer 140 does not completely fill opening 101. As a result, one or more voids 150 (e.g., spaces inside opening 101 that are not filled by conductive layer 140) are formed. Voids 150 may increase contact resistance and reduce the reliability of electrical connections of semiconductor devices, and therefore, it may be advantageous to form conductive features without voids.

Figure 2C:
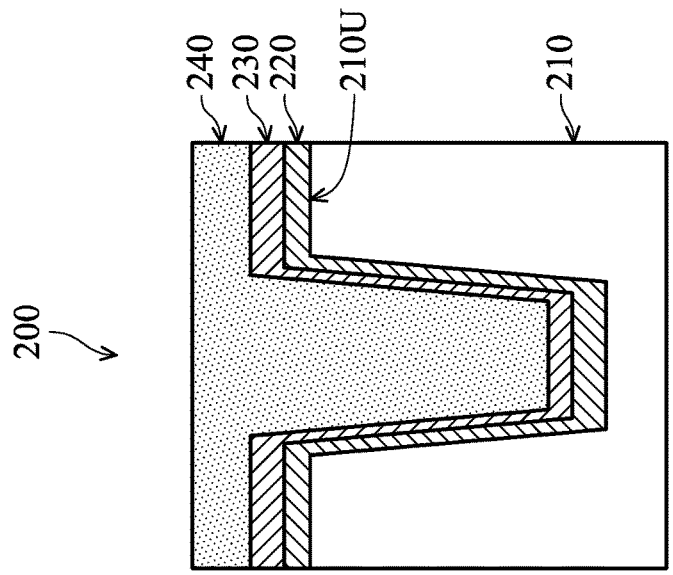

FIGS. 2A-2D illustrate cross-sectional views of a semiconductor device 200 at various stages of manufacturing, in accordance with some embodiments. Referring to FIG. 2A, a semiconductor device 200 is provided. Semiconductor device 200 may be an integrated circuit (IC) chip, system on chip (SoC), or portion thereof, that may include various passive and active microelectronic devices such as resistors, capacitors, inductors, diodes, and/or transistors. Semiconductor device 200 includes a substrate 203. Substrate 203 may be a portion of a semiconductor wafer. Substrate 203 may be formed of a semiconductor material such as silicon, germanium, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, substrate 203 may be a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate may be doped with a p-type dopant, such as boron, aluminum, gallium, or the like, although the substrate may also be doped with an n-type dopant, such as phosphorous, arsenic, or the like.

Substrate 203 may include active and/or passive devices. As one of ordinary skill in the art will recognize, a wide variety of devices such as transistors, capacitors, resistors, inductors, combinations of these, and the like may be used to generate the structural and functional requirements of the design for semiconductor device 200. Only a portion of substrate 203 is illustrated in FIGS. 2A-2D, and device 205 in FIG. 2A may comprise or be at least a part of a device, (e.g., transistors, resistors, capacitors, inductors, and diodes). In some embodiments, device 205 may comprise an IC circuit that include a plurality of devices (e.g., transistors, resistors, capacitors, inductors, and diodes) and the interconnect structures (e.g., conductive lines and vias) that connect the devices to achieve certain functions of the IC circuit. Substrate 203 and device 205 are not shown in FIGS. 2B-2D, with the understanding that semiconductor device 200 includes substrate 203 and device 205. Although the example of FIGS. 2A-2D only shows one opening 201 and one device 205, skilled artisans will appreciate that more than one openings 201 and/or more than one devices 205 may be formed on or in substrate 203.

A dielectric layer 210 is formed over substrate 203. Dielectric layer 210 may be a single layer or a multi-layered structure. Dielectric layer 210 may be formed of nitrides such as silicon nitride, oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. Dielectric layer 210 may be deposited by chemical vapor deposition (CVD), physical vapor deposition (PVD), atomic layer deposition (ALD), a spin-on-dielectric (SOD) process, the like, or a combination thereof. In an embodiment, dielectric layer 210 is formed directly on an upper surface of substrate 203. In other embodiments, dielectric layer 210 is formed on intermediate layers and/or structures (not shown) which are on substrate 203. For example, dielectric layer 210 may be an ILD layer or an IMD layer of semiconductor device 200.

Still referring to FIG. 2A, an opening 201 (may also be referred to as a trench, a recess, etc.) is formed in dielectric layer 210, using, e.g., photolithographic and etching techniques, such as immersion photolithography, ion-beam writing, extreme ultraviolet lithography (EUV), or other suitable processes. Next, a thin diffusion barrier layer 220 is deposited by known deposition methods such as CVD over sidewalls 210S, bottom surface 210B and upper surface 210U of dielectric layer 210, in some embodiments. Diffusion barrier layer 220 functions to prevent metal atoms, such as copper atoms, from diffusing into the dielectric layer 210 when metal lines and/or metal vias are later formed. In an embodiment, the diffusion barrier layer 220 includes tantalum (Ta), tantalum nitride ($TaN_x$), titanium (Ti), titanium nitride ($TiN_x$), manganese oxide ($MnO_x$), the like, and/or combinations thereof. In an embodiment, the diffusion barrier layer 220 has a thickness that is less than about 150 Angstroms (Å), although other dimensions are possible depending on design requirements and process technology (e.g., 28 nm, or 5 nm) used. In some embodiments, diffusion barrier layer 220 is separated from device 205 by dielectric layer 210, and is not electrically coupled to device 205. In other embodiments, diffusion barrier layer 220 is electrically coupled to device 205 by conductive feature 207 (shown in phantom). Conductive feature 207 may be a contact plug formed in dielectric layer 210 before diffusion barrier layer 220 is formed, as an example. Conductive feature 207 may be the interconnect structure of device 205, as another example. In yet another embodiment, opening 201 exposes device 205 (not shown), and diffusion barrier layer 220 directly contacts device 205. For example, device 205 may include a source/drain region of a transistor, diffusion barrier layer 220 and other subsequently formed conductive layers (e.g., seed layer 230 and conductive layer 240, see FIGS. 2B-2D) may contact the source/drain region and form a source/drain contact. Other possible ways of connection between diffusion barrier layer 220 and device 205 are possible, and are fully intended to be included within the scope of the present disclosure. Conductive feature 207 is not shown in FIGS. 2B-2D, with the understanding that semiconductor device 200 may include conductive feature 207.

Turning now to FIG. 2B, a seed layer 230 is formed on diffusion barrier layer 220, in accordance with some embodiments. Seed layer 230 may include an electrically conductive material. In some embodiments, seed layer is formed using titanium (Ti), tantalum (Ta), tungsten (W), aluminum (Al), cobalt (Co), hafnium (Hf), zirconium (Zr), Ruthenium (Ru), or the like, and may be formed by suitable deposition methods such as PVD and CVD. The seed layer may be formed to a thickness of about 10 Å to about 100 Å, although other thicknesses could be employed depending upon, e.g., the application and the process technology used. As illustrated in FIG. 2B, an overhang 203 is formed proximate corner region 210C between upper surface 210U of dielectric layer 210 and sidewalls 210S of dielectric layer 210. Left untreated, overhang 203 may cause voids to be formed in a subsequent process to fill opening 201.

Referring to FIG. 2C, an etching process 235 is performed to remove or reduce overhang 203 using an etchant. Etching process 235 is performed in-situ in a same processing chamber (e.g., a deposition chamber, not shown) used to form seed layer 230, in some embodiments. In other embodiments, etching process 235 is performed in another chamber (e.g., an etch chamber), then semiconductor device 200 is transferred back to the deposition chamber (not shown) used to form seed layer 230 for further processing. The etchant may be an etching gas comprising a halide of the metal used for forming seed layer 230. A halide is a binary compound comprising a halogen element (e.g., fluorine (F), chlorine (Cl), bromine (Br), iodine (I), and astatine (At)) and another element that is less electronegative (or more electropositive) than the halogen. Therefore, a halide may be a fluoride, a chloride, a bromide, an iodide, or an astatide. For example, if seed layer 230 is formed using Ti, a halide $TiCl_4$ may be used as an etchant for etching process 235. The halide (e.g., $TiCl_4$) reacts with, and therefore, removes its constituent metal (e.g., Ti), in some embodiments. As an example, the reaction between Ti and halide $TiCl_4$ may be described by chemical equation (1) below, where (g) stands for gaseous state, (s) stands for solid state, and x has a value ranging from 1 to 3.

$$3TiCl_{4(g)} + Ti_{(s)} \leftrightharpoons TiCl_{x(g)} \qquad (1)$$

As described by chemical reaction (1) above, solid Ti reacts with gaseous TiCl₄, the product of the reaction (e.g., TiCl$_x$) is gaseous and therefore, may be removed easily. The etching gas used for removing overhang 203 may also include H₂ and Ar. Skilled artisans will appreciate that the chemical reaction described by chemical equation (1) may also produce Cl₂, which may react with H₂ to form HCl. As a result, HCl is present during etching process 235, although HCl may not be directly supplied to the reaction chamber (e.g., the deposition chamber used in the in-situ etching process), in some embodiments.

The etchant used for removing/reducing overhang is not limited to a halide of metal. In some embodiments, dry etching gases such as Cl₂ or BCl₃, wet etching chemicals such as SPM, SC1, or SC2, combinations thereof, or the like, may be used to remove or reduce overhang 203. Chemical equations (2) and (3) below illustrate examples of other chemical reactions between the metal (e.g., Ti) of seed layer 230 and the etchant. Equations (1)-(3) are merely examples, other chemical reactions between seed layer 230 and suitable etchant(s) are possible and are intended to be included within the scope of the present disclosure.

$$Ti_{(s)} + 4HCl_{(g)} \leftrightharpoons TiCl_{4(g)} + 2H_2 \qquad (2)$$

$$Ti_{(s)} + Cl_2 \leftrightharpoons TiCl_{4(g)} \qquad (3)$$

In accordance with an embodiment of the present disclosure, seed layer 230 is formed using Ti, and etching process 235 is performed with a flow rate of TiCl₄ between about 3 standard cubic centimeter per minute (sccm) and about 50 sccm, a flow rate of H₂ between about 0 sccm and about 4000 sccm, and a flow rate of Ar between about 0 sccm and about 4000 sccm. Etching process 235 may be performed at a temperature between about 350° C. and 650° C., and under a pressure between about 1 torr and about 6 torr. Etching process 235 removes or reduces overhang 203, and portions of seed layer 230 remaining after etching process 235 substantially conform to the underlying diffusion barrier layer 220, as shown in FIG. 2C.

Figure 2D:
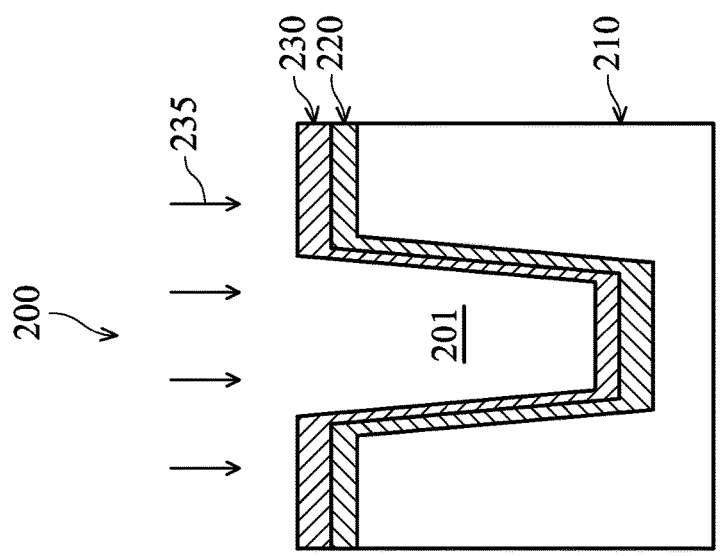

Next, as illustrated by FIG. 2D, a conductive layer 240 is formed on seed layer 230 using, e.g., an electro-plating or electro-less plating technique to fill the opening 201. Conductive layer 240 may include copper (Cu), aluminum (Al), tungsten (W), cobalt (Co), ruthenium (Ru) alloys thereof, or other suitable conductive material. Note that since etching process 235 removes or reduces the overhang before conductive layer 240 is formed, conductive layer 240 fills opening 201 without voids. For example, conductive layer 240 extends from the bottom of opening 201 to the upper surface 210U of dielectric layer 210 without unfilled spaces in where opening 201 used to be.

Additional processing may follow the processing shown in FIG. 2D. For example, a chemical mechanical planarization (CMP) process may be performed to remove conductive layer 240 that are disposed outside opening 201, e.g., above the upper surface 210U of dielectric layer 210, to form conductive structures such as metal lines. The disclosed embodiment advantageously avoids the formation of voids in the conductive feature, thus reducing resistance of the conductive feature and improving the reliability of electrical connection.

Figure 3B:
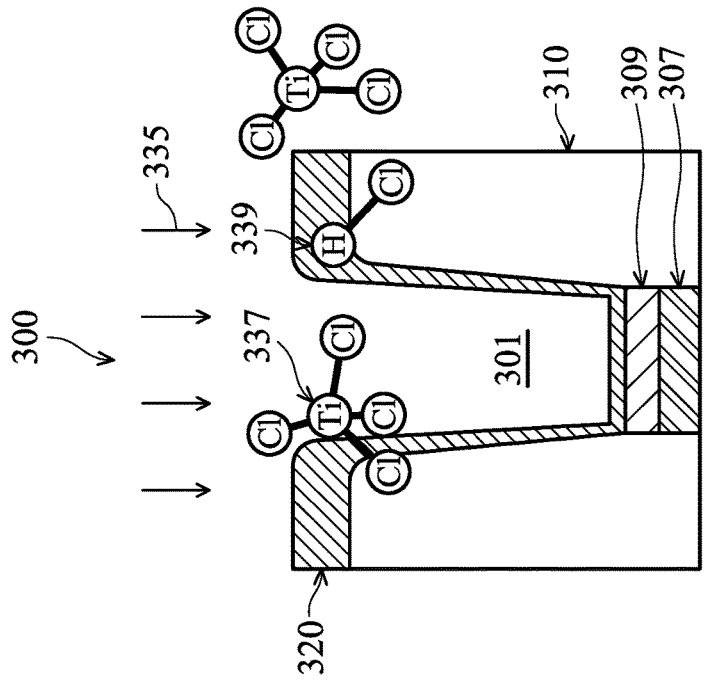
FIGS. 3A to 3H illustrate cross-sectional views of a semiconductor device at various stages of fabrication, in accordance with other embodiments.
Figure 3A:
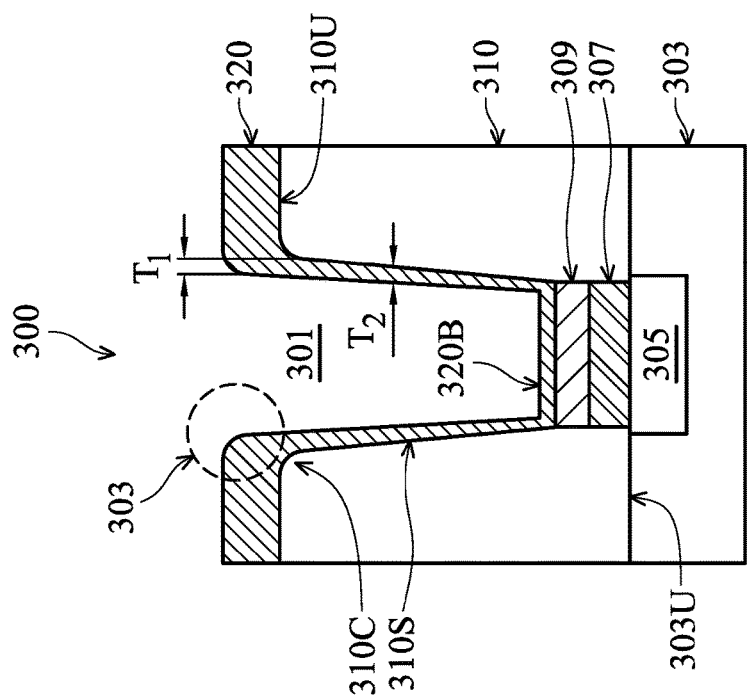

FIGS. 3A-3H illustrate cross-sectional views of a semiconductor device 300 at various stages of fabrication, in accordance with some embodiments. As illustrated in FIG. 3A, semiconductor device 300 may be an IC, an SoC, or portion thereof, that may include various passive and active microelectronic devices such as resistors, capacitors, inductors, diodes, and/or transistors. Semiconductor device 300 includes a substrate 303, which may be a portion of a semiconductor wafer. Substrate 303 may be similar to substrate 203 in FIG. 2A, thus details are not repeated here.

Substrate 303 may include active and/or passive devices. As one of ordinary skill in the art will recognize, a wide variety of devices such as transistors, capacitors, resistors, inductors, combinations of these, and the like may be used to generate the structural and functional requirements of the design for semiconductor device 300. Only a portion of substrate 303 is illustrated in FIGS. 3A-3H, and device 305 in FIG. 3A may comprise or be at least a part of a device, such as a transistor. Substrate 303 and device 305 are not shown in FIGS. 3B-3H, with the understanding that semiconductor device 300 includes substrate 303 and device 305. Although the example of FIGS. 3A-3H only shows one opening 301 and one device 305, skilled artisans will appreciate that more than one openings 301 and/or more than one devices 305 may be formed on or in substrate 303.

Next, a dielectric layer 310 is formed over substrate 303. Dielectric layer 310 may be a single layer or a multi-layered structure. The composition and formation methods of dielectric layer 310 may be similar to those of dielectric layer 210 in FIG. 2A, therefore the details are not repeated here. In an embodiment, dielectric layer 310 is formed directly on an upper surface of substrate 303. In other embodiments, dielectric layer 310 is formed on intermediate layers and/or structures (not shown) which are on substrate 303. For example, dielectric layer 310 may be an ILD layer or an IMD layer of semiconductor device 300.

Still referring to FIG. 3A, an opening 301 (may also be referred to as a trench, a recess) is formed in dielectric layer 310, using, e.g., photolithographic and etching techniques, such as immersion photolithography, ion-beam writing, EUV, or other suitable processes. Opening 301 creates or defines sidewalls 310S of dielectric layer 310, in some embodiments. In the example of FIG. 3A, opening 301 further exposes a semiconductor or metallization region 307 at the bottom of opening 301. Region 307 includes Si, SiGe, Ge, Group IV element, Group III-V element, Group II-VI element, Group III-VI element, metals, alloys, combination thereof, or the like, in some embodiments. The metals of region 307, if present, may include any suitable metal, for example, nickel, titanium, cobalt, tungsten, tantalum, platinum, ruthenium and palladium. Region 307 may be an epitaxial semiconductor region of, e.g., a source/drain region of a transistor. Region 307 may be referred to as silicon region 307 in the present disclosure, with the understanding that silicon region 307 may include silicon or other suitable semiconductor materials or metal alloys, such as those listed above for region 307. Region 307 extends above an upper surface 303U of substrate 303, as illustrated in the example of FIG. 3A. In other embodiments, the upper surface of region 307 may be substantially level (not shown) with upper surface 303U of substrate 303.

Next, a thin liner 320 is formed by suitable deposition methods such as CVD over region 307 at the bottom of opening 301, and over sidewall 310S and upper surface 310U of dielectric layer 310. Liner 320 may be an adhesion layer, a seed layer, or a diffusion barrier layer, and may include tantalum (Ta), tantalum nitride (TaN$_x$), titanium (Ti), titanium nitride (TiN$_x$), manganese oxide (MnO$_x$), the like, and/or combinations thereof. In other embodiments, liner 320 is formed using titanium (Ti), tantalum (Ta), tungsten (W), aluminum (Al), cobalt (Co), hafnium (Hf), zirconium (Zr), or the like, and any suitable deposition methods, such as CVD, may be used to form liner 320. Due to the high temperature of the deposition process for forming liner 320, the deposited liner layer 320 may react with at least a top portion of silicon region 307 to form a silicide region 309, a germano-silicide region 309, or a metal alloyed region 309. Region 309 may include a compound of a semiconductor material and a metal, a metal stack, or alloys of more than two metals, where the semiconductor material may be any suitable semiconductor materials, such as those listed above for semiconductor region 307 (e.g., Si, Ge, SiGe, Group IV, Group III-V, Group II-VI element, and Group III-VI element), and the metal may be any suitable metal for forming silicide, for example, nickel, titanium, cobalt, tungsten, tantalum, platinum, ruthenium and palladium. For example, a liner layer 320 comprising Ti may be formed in a CVD chamber with a temperature between about 300° C. to about 600° C., and a silicide region 309 comprising $TiSi_x$ may be formed due to the reaction between deposited Ti and silicon region 307. As illustrated in FIG. 3A, silicide region 309 is disposed between a lower (unreacted) portion of silicon region 307 and liner layer 320B at the bottom of opening 301. A thickness of silicide region 309 may range from about 3 nm to about 10 nm, in some embodiments. Region 309 may be referred to as silicide region 309 in the present disclosure, with the understanding that region 309 may be or include a silicide region, a germano-silicide region, or a metal alloyed region.

As illustrated in FIG. 3A, an overhang 303 is formed at corner region 310C between upper surface 310U and sidewalls 310S of dielectric layer 310. Overhang 303 may not protrude from corner region 310C toward opening 301 as much as overhang 103 illustrated in FIG. 1A, and may exhibit as a liner 320 having a large thickness, especially around corner region 310C of dielectric layer 310 and along upper surface 310U of dielectric layer 310. In the example of FIG. 3A, an overhang may refer to a difference of more than 1 nm between a first thickness $T_1$ of liner 320 at corner region 310C and a second thickness $T_2$ of liner 320 along sidewall 310S. In other embodiments, an overhang may refer to a difference of more or less than 1 nm, depending on, e.g., the process technology used and/or the size of opening 301.

Referring to FIG. 3B, an etching process 335 is performed to remove or reduce overhang 303 using an etchant. Etching process 335 is performed in-situ in a same deposition chamber (not shown) used to form liner 320, in some embodiments. In other embodiments, etching process is performed in another chamber (e.g., an etch chamber), then semiconductor device 300 is transferred back to the deposition chamber (not shown) used to form liner layer 320 for further processing. The etchant may be an etching gas comprising a halide of the metal used for forming liner 320. In other embodiments, dry etching gas such as $Cl_2$ or $BCl_3$, wet etching chemicals such as SPM, SC1, or SC2, or combinations thereof, are used as the etchant. Chemical equation (1) above describes the reaction between Ti and halide $TiCl_4$. The etching gas may also include $H_2$ and/or Ar, which may react with byproduct (e.g., $Cl_2$) of the chemical reaction and form HCl, as noted above. Halide 337 ($TiCl_4$) and HCl 339 are illustrated in FIG. 3B. Equations (2) and (3) illustrate examples of other possible chemical reactions.

In accordance with an embodiment of the present disclosure, liner 320 comprises Ti, and etching process 335 is performed with a flow rate of $TiCl_4$ between about 3 sccm and about 50 sccm, a flow rate of $H_2$ between about 0 sccm and about 4000 sccm, and a flow rate of Ar between about 0 sccm and about 4000 sccm. Etching process 335 may be performed at a temperature between about 350° C. and 650° C. The pressure of etching process 335 may range from about 1 torr to about 6 torr.

Figure 3D:
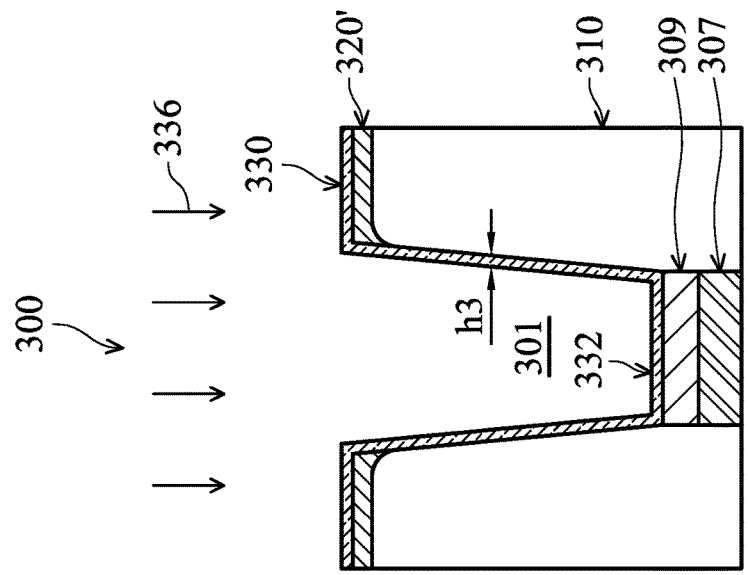
Figure 3C:
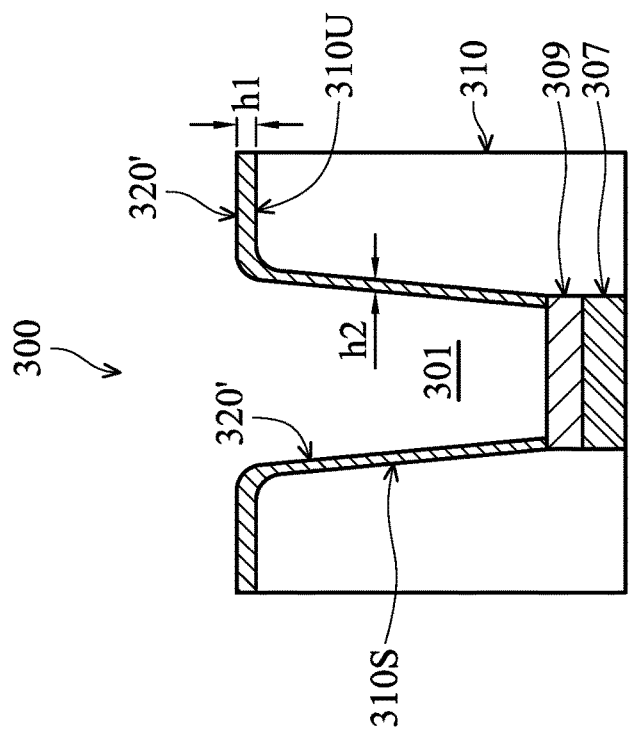

FIG. 3C illustrates semiconductor device 300 after the etching process 335. Overhang 303 is removed or reduced, and a remaining portion 320' (also referred to as liner 320' hereinafter) of liner 320 has a first thickness $h_1$ along upper surface 310U of dielectric layer 310 and a second thickness $h_2$ along sidewalls 310S of dielectric layer 310. In some embodiments, $h_1$ ranges from about 1 to about 4 nm, and $h_2$ ranges from about 0 nm to about 2.5 nm. The halide/etchant used in etching process 335 has an etching selectivity of its constituent metal (e.g., the metal of liner 320) over region 309. Consequently, the etchant used in etching process 335 reacts with liner 320 without substantially attacking region 309, and as a result, liner 320 is removed or reduced by etching process 335 while region 309 is substantially intact. As shown in FIG. 3C, region 309 is advantageously exposed by opening 301 after etching process 335 for subsequent processing without being removed or damaged by etching process 335. In some embodiments, etching process 335 completely removes liner 320 disposed over sidewalls 310S of dielectric layer 310 (e.g., second thickness $h_2$ equals zero), in which case a re-deposition process (not shown) is performed to form liner 320 over sidewalls 310S of dielectric layer 310, before the subsequent processing shown in FIG. 3D is performed.

Still referring to FIG. 3C, the halide (e.g., $TiCl_4$) used in etching process 335 has an etching selectivity of its constituent metal (e.g., Ti) over an oxide (e.g., Ti:O) of the constituent metal, in some embodiments. An oxide (e.g., Ti:O) of the metal of liner 320 may be formed by inter-diffusion between deposited liner 320 (e.g., Ti) and oxygen in dielectric layer 310 (e.g., a silicon dioxide layer 310). For example, inter-diffusion may produce an oxide layer 320' (e.g., Ti:O) along sidewall 310S and upper surface 310U of dielectric layer 310. Therefore, liner 320 may be considered as having an outer layer (not shown in FIG. 3C) which contains the metal (e.g., Ti) used in forming liner 320, and an inner layer 320' under the outer layer containing an oxide (e.g., Ti:O) of the metal. Due to the etching selectivity of the halide, etching process 335 removes the outer layer (e.g., Ti) of liner 320 and leaves inner layer 320' (e.g., Ti:O), which is the oxide layer, in some embodiments. The inner layer 320' may have a molecular density of the oxide (e.g., Ti:O) between about 5% and about 10%, which molecular density may provide the etch selectivity to stop the etching process at the inner layer 320'. The halide's etching selectivity of its constituent metal over an oxide of the constituent metal results in a self-limiting behavior of etching process 335, which removes the constituent metal (e.g., Ti) without substantially attacking the oxide (e.g., Ti:O) of the constituent metal, thus automatically leaving behind the inner layer 320' for subsequent processing without using extra patterning or photolithography. This illustrates another advantage of the embodiment methods Next, referring to FIG. 3D, an treatment 336 is performed to oxidize, nitride, or carbonize liner 320' and silicide region 309 to form a treated layer 330 and a treated layer 332, respectively. The treatment 336 produces alloyed layers 330/332, in some other embodiments. In an exemplary embodiment, treatment 336 uses $NH_3$ to react with liner 320' and silicon region 309, so that liner 320' and silicon region 309, or portions thereof, turn into nitride layers 330 and 332, respectively. Treated layers 330/320 may have a uniform thickness $h_3$, which may range from about 1 nm to about 2.5 nm as an example, although other dimensions may also be possible. Note that liner 320' may have a thickness $h_1$ along upper surface 310U of dielectric layer 310 that is larger than a thickness $h_2$ along sidewall 310S of dielectric layer 310 (see FIG. 3C), therefore, liner 320' along sidewall 310S of dielectric layer 310 may be fully nitrided and turn into treated layer 330, whereas only an upper portion of liner 320' along upper surface 310U may turn into nitride layer 330. A top portion of silicon region 309 exposed at the bottom of opening 301 may react with $NH_3$ to form a nitride layer 332. In the embodiment where liner 320' includes Ti:O and silicide region 309 includes $TiSi_x$, the nitride layer 330 includes TiON, and the nitride layer 332 includes TiSiN.

Figure 3F:
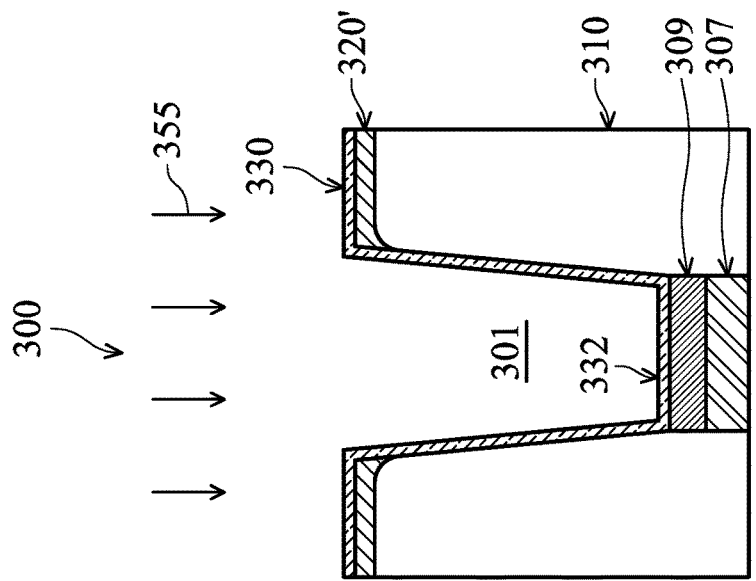
Figure 3E:
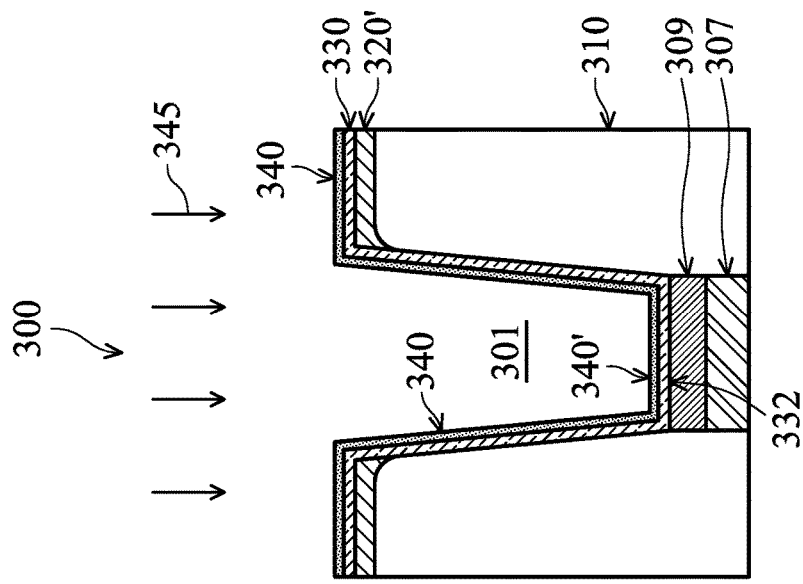

Next, referring to FIG. 3E, an anneal process 345 is performed. Recall that silicide region 309 was formed during the deposition process of liner 320 (see FIG. 3A), and no dedicated silicide anneal process was performed. Anneal process 345, also referred to silicide anneal process 345, may be performed to enhance the silicide region 309. In accordance with some embodiments, anneal process 345 is performed using suitable anneal processes such as thermal soaking, spike anneal, millisecond anneal, and laser anneal. In an embodiment in which the anneal process 336 is thermal soaking, the anneal process 336 is performed at a temperature between about 450° C. to about 600° C., for a time period of between 10 seconds to about 60 seconds. In an embodiment in which the anneal process 336 is spike anneal, the anneal process 336 is performed at a temperature between about 600° C. to about 750° C., for a time period of between 1 seconds to about 2 seconds. In an embodiment in which the anneal process 336 is millisecond anneal, the anneal process 336 is performed at a temperature between about 700° C. to about 900° C., for a time period of between 0.25 milliseconds to about 2 milliseconds.

As a result of anneal process 345, an oxide layer 340/340' is formed at the outer surface of treated layers 330/332, in some embodiments. Oxide layer 340/340' may also be formed due to vacuum break, e.g., when semiconductor device 300 is transported between processing chambers and there is a vacuum break during the transportation. Anneal process 345 may change the phase and/or composition of silicide region 309, therefore, the hatch pattern of silicide region 309 is changed in FIGS. 3E-3H to reflect that.

Next, as illustrated in FIG. 3F, a reduction process 355 (also referred to as an oxide reduction process 355) is performed to reduce oxide 340/340'. Reduction process 355 is performed using a reducing gas including $H_2$, $N_2$ and $NH_3$, in some embodiments. In other embodiments, reduction process 355 is performed by a plasma process using, e.g., a $H_2$ plasma as a reducing agent. Reduction process 355 turns oxide layer 340/340' back into treated layer 330/332, in some embodiments.

Figure 3H:
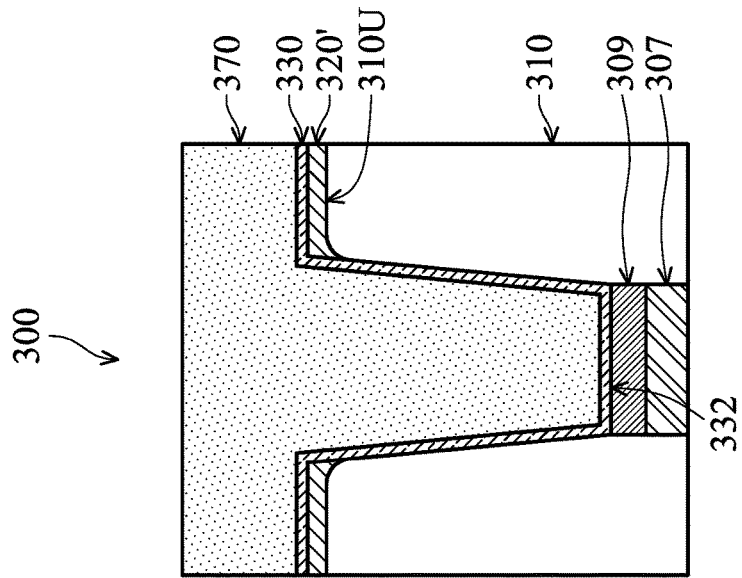
Figure 3G:
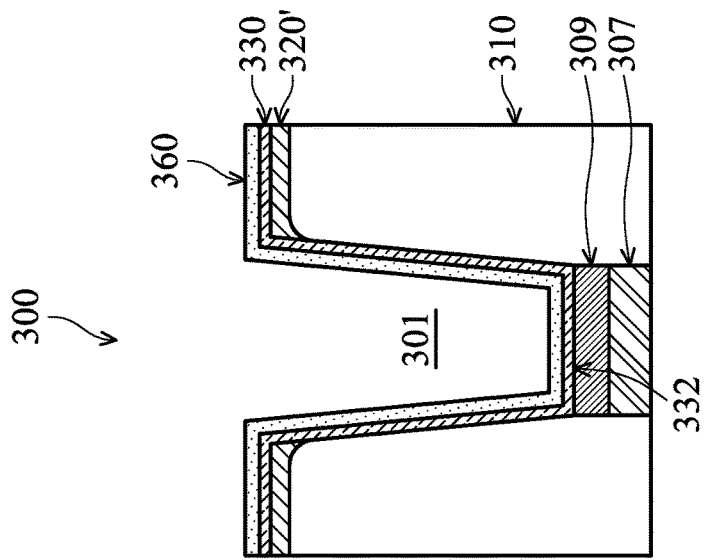

Referring now to FIG. 3G, a seed layer 360 is formed on treated layers 330/332, in accordance with some embodiments. In accordance with an embodiment, seed layer 360 is made of copper and is formed by PVD. However, other conductive film may also be used. For example, seed layer 360 may be made of Ti, Ti alloy, Cu, and/or Cu alloy. In the example of FIG. 3G, seed layer 360 does not show an overhang. In cases where seed layer 360 has an overhang, a halide of the metal of seed layer 360 may be used to remove or reduce the overhang of seed layer 360, similar to the reduction of overhang of liner 320 discussed above.

Referring to FIG. 3H, a conductive layer 370 is formed over seed layer 360 to fill opening 301. In some embodiments, conductive layer 370 is made of copper, or a copper alloy, and is formed by an electro-plating or electro-less plating process. In other embodiments, conductive layer 370 includes copper (Cu), aluminum (Al), tungsten (W), cobalt (Co), ruthenium (Ru), alloys thereof, or other suitable conductive material. Note that since etching process 335 removes the overhang before conductive layer 370 is formed, conductive layer 370 fills opening 301 without voids. For example, conductive layer 370 extends from the bottom of opening 301 to the upper surface 310U of dielectric layer 310 without unfilled spaces in where opening 301 used to be.

Additional processing may follow the processing shown in FIG. 3H. For example, a CMP process may be performed to remove conductive layer 370 that are disposed outside opening 301, e.g., above the upper surface 310U of dielectric layer 310, to form conductive structures such as contact plugs. The disclosed embodiment advantageously avoids the formation of voids in the conductive feature, thus reducing resistance of the conductive feature and improving the reliability of electrical connection of semiconductor device 300.

FIGS. 4A-4H illustrate cross-sectional views of a semiconductor device 400 at various stages of fabrication, in accordance with some embodiments. Similar numbers in FIGS. 4A-4H and FIGS. 3A-3H denote similar components, with numbers in FIGS. 3A-3H starting with a digit "3" and numbers in FIGS. 4A-4H starting with a digit "4." For example, number 303 denotes a substrate in FIG. 3A, and number 403 denotes a substrate in FIG. 4A. Unless otherwise specified, corresponding components (e.g., 303 and 403) in FIGS. 4A-4H and FIGS. 3A-3H have similar compositions and are formed by similar formation methods, details of which are not repeated in the description below.

Figure 4B:
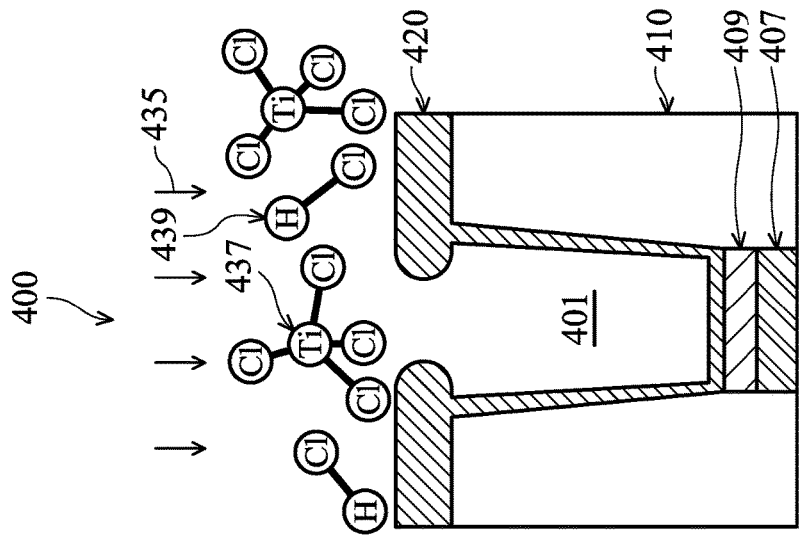
FIGS. 4A to 4H illustrate cross-sectional views of a semiconductor device at various stages of fabrication, in accordance with yet other embodiments.
Figure 4A:
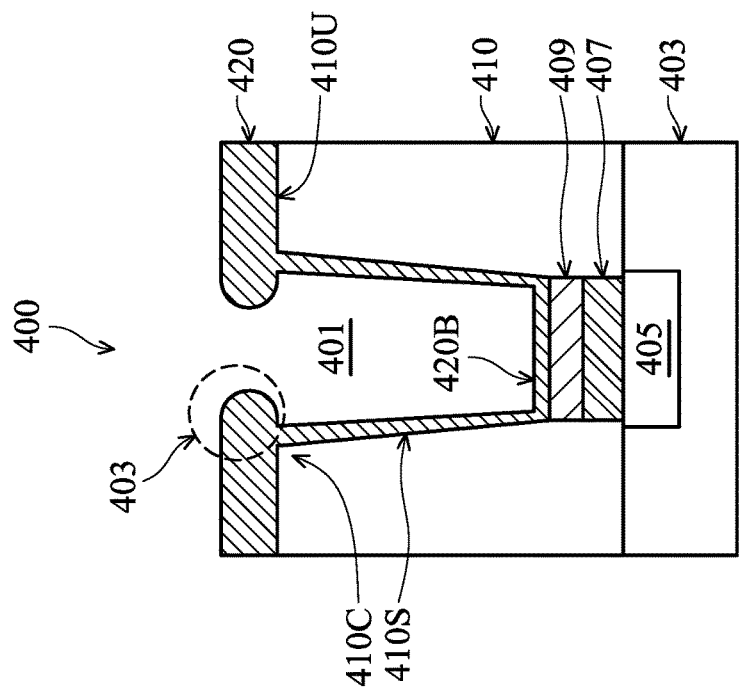

FIG. 4A illustrates a semiconductor device 400 having a substrate 403 with a device 405 (e.g., a transistor). A liner 420 is formed over upper surface 410U of dielectric layer 410, over sidewall 410S of dielectric layer 410, and over a silicon region 407 exposed by opening 401, in some embodiments. Liner 420 is formed by any suitable deposition process such as CVD or PVD, in some embodiments. In an embodiment, a liner 420 containing Ti is formed by a PVD process at a temperature between about 300° C. and about 600° C. Deposited liner 420 may react with silicon region 407 to form a silicide region 409, which is disposed between an (unreacted) lower portion of silicon region 407 and a bottom portion 420B of liner 420, as illustrated in FIG. 4A. Due to the deposition process used, e.g., the PVD process, overhang 403 of liner 420 protrudes toward the opening (e.g., opening 401) more than overhang 303 of liner 320 (e.g., formed by a CVD process) in FIG. 3A, in some embodiments.

Figure 4D:
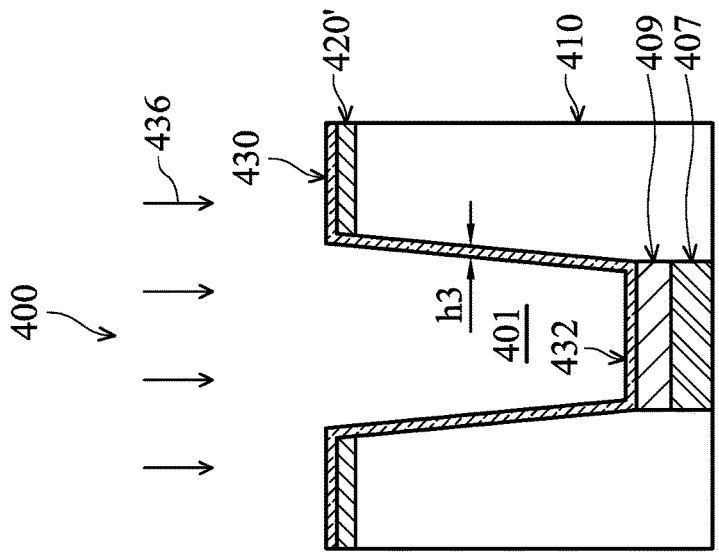
Figure 4C:
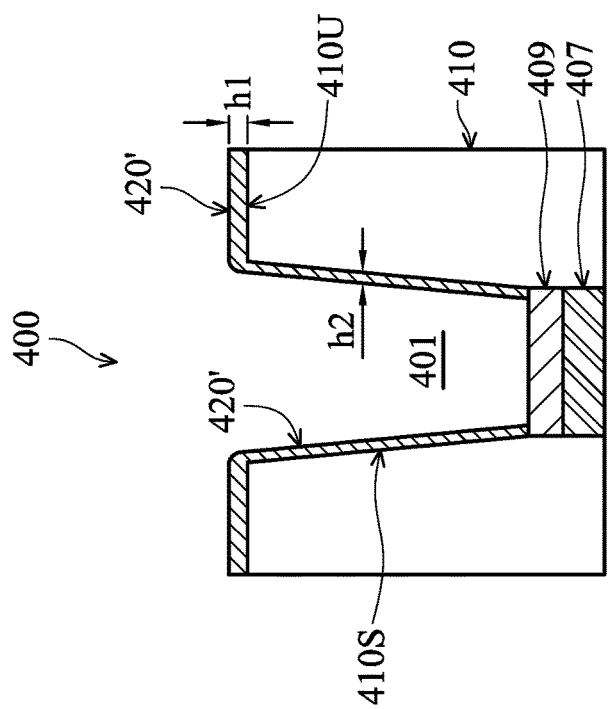
Figure 4E:
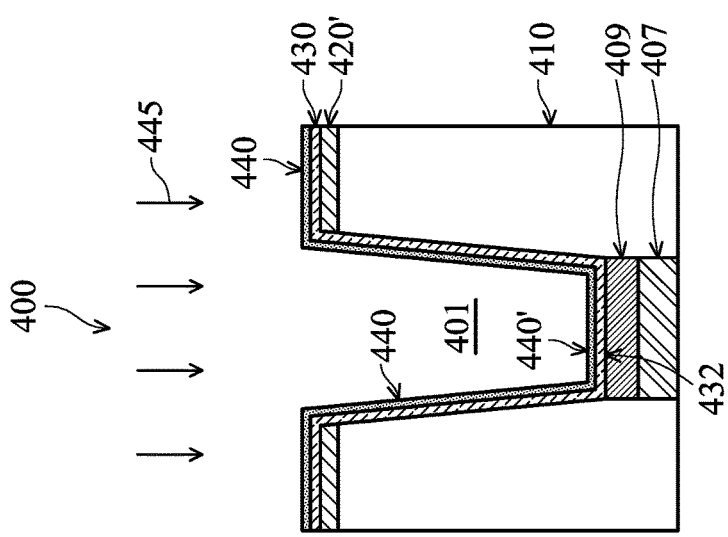
Figure 4F:
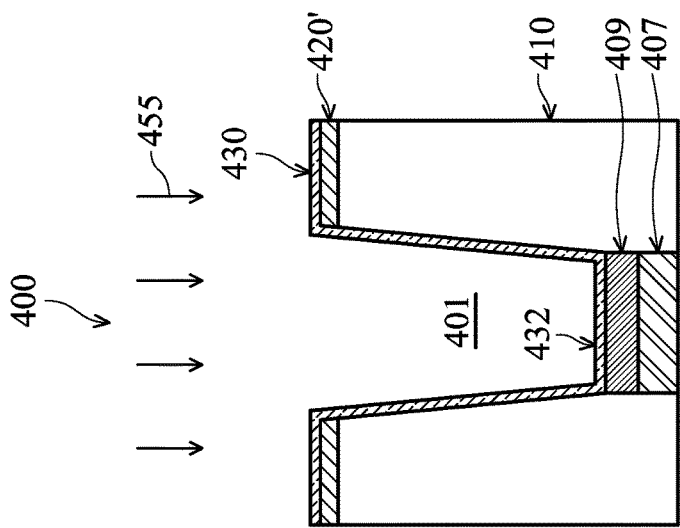
Figure 4H:
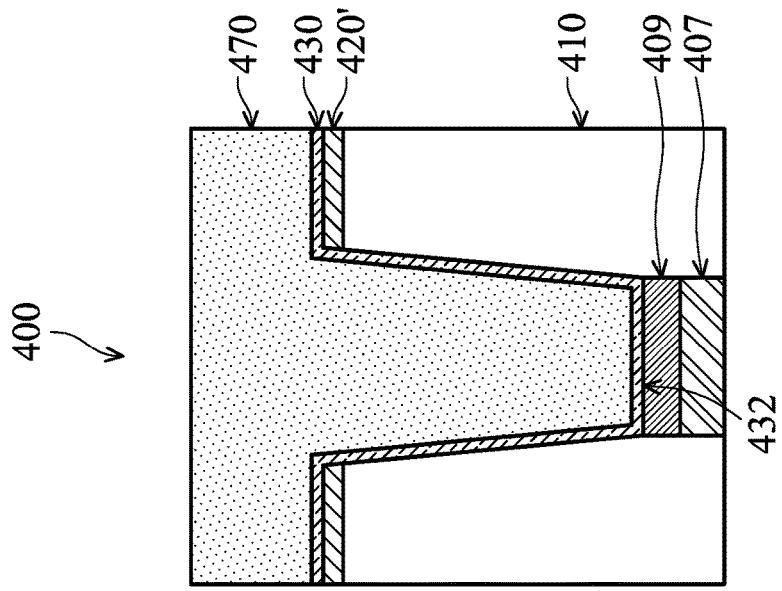
Figure 4G:
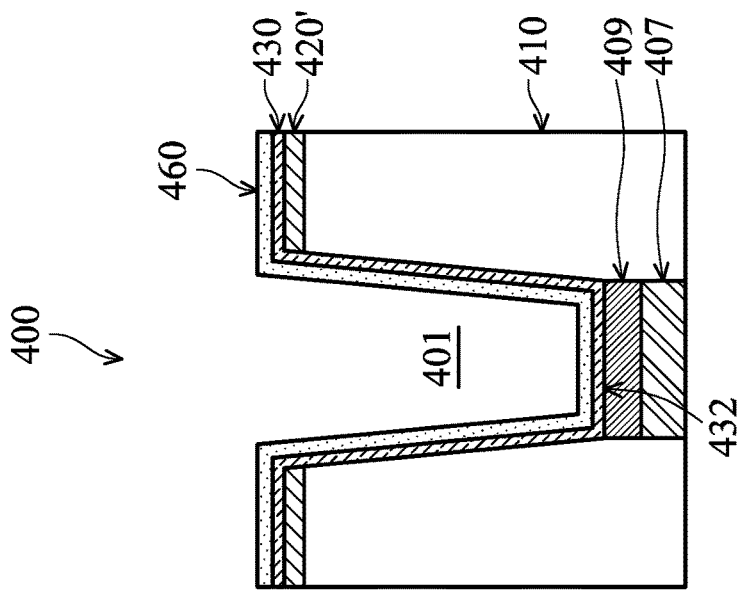

Substrate 403 and device 405 are not shown in FIGS. 4B-4D, with the understanding that semiconductor device 400 includes substrate 403 and device 405. Although the example of FIGS. 4A-4D only shows one opening 401 and one device 405, skilled artisans will appreciate that more than one openings 401 and/or more than one devices 405 may be formed on or in substrate 403.

FIG. 4B illustrates an etching process 435 to remove or reduce overhang 403 using a halide of the metal of liner 420. FIG. 4C illustrates semiconductor device 400 after etching process 435. Details are similar to the etching process 335 discussed with reference to FIGS. 3B and 3C, thus are not repeated here. In accordance with an embodiment of the present disclosure, liner 420 is formed using Ti, and etching process 435 is performed with a flow rate of $TiCl_4$ between about 3 sccm and about 50 sccm, a flow rate of $H_2$ between about 0 sccm and about 4000 sccm, and a flow rate of Ar between about 0 sccm and about 4000 sccm. Etching process 435 may be performed at a temperature between about 350° C. and 650° C. The pressure of etching process 435 may range from about 1 torr to about 6 torr.

FIGS. 4D-4H illustrate the processing steps after the etching process 435, e.g., treatment 436, anneal process 445, oxide reduction process 455, forming seed layer 460, and filling opening 401 with conductive layer 470. Details of these processing steps are similar to the corresponding steps described with reference to FIGS. 3D-3H, thus are not repeated here.

The embodiments disclosed in the present disclosure are merely examples. Skilled artisans will readily appreciate many variations and combinations that are within the scope of the present disclosure. For example, the example in FIGS. 2A-2D illustrates overhang reduction for overhang formed in a seed layer (e.g., seed layer 230), and the example in FIGS. 3A-3H illustrate overhang reduction for overhang formed in a liner layer (e.g., liner 320). In cases where both the liner layer and the seed layer have overhangs, the overhang reduction methods disclosed in the present disclosure may be combined to reduce the overhangs, or sidewall liner. For example, after the liner layer is formed, processing steps similar to those illustrated in FIGS. 3B-3F may be used to reduce the overhang of the liner layer, and after the seed layer is formed over the liner layer, processing steps similar to those of FIGS. 2C-2D may be used to reduce the overhang of the seed layer and fill the opening with the metal layer. These and other possible variations are fully intended to be included within the scope of the present disclosure.

Figure 5:
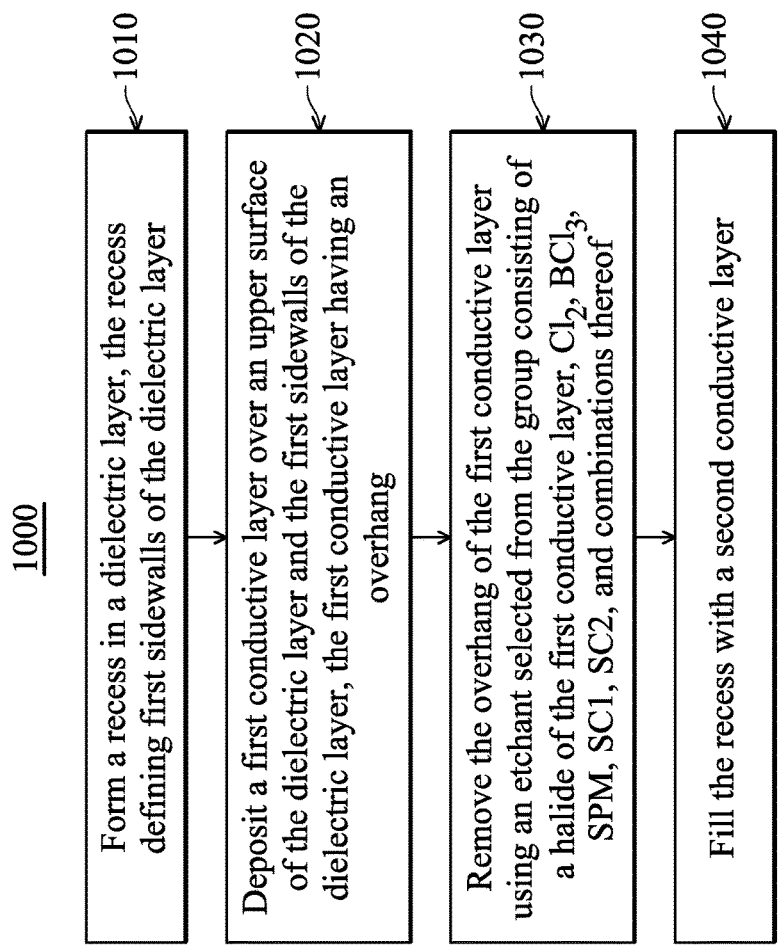
FIG. 5 illustrates a flow diagram of method of fabricating a semiconductor device, in some embodiments.

FIG. 5 illustrates a flow chart of a method of forming a semiconductor device, in accordance with some embodiments. It should be understood that the embodiment method shown in FIG. 5 is an example of many possible embodiment methods. One of ordinary skill in the art would recognize many variations, alternatives, and modifications. For example, various steps as illustrated in FIG. 5 may be added, removed, replaced, rearranged and repeated.

Referring to FIG. 5, at step 1010, a recess is formed in a dielectric layer, the recess defining first sidewalls of the dielectric layer. At step 1020, a first conductive layer is deposited over an upper surface of the dielectric layer and the first sidewalls of the dielectric layer, the first conductive layer having an overhang. At step 1030, the overhang of the first conductive layer is removed using an etchant selected from the group consisting of a halide of the first conductive layer, $Cl_2$, $BCl_3$, SPM, SC1, SC2, and combinations thereof. At step 1040, the recess is filled with a second conductive layer.

Advantages of disclosed embodiments include reduced resistance for conductive features (e.g., contact plugs, vias, or conductive lines) and more reliable electrical connections. By removing the overhang of a conductive liner layer or removing conductive liner layer on sidewall before a subsequent metal plug-filling process (e.g., forming conductive layer 240 in opening 201), voids are avoided in the formed conductive features. The disclosed overhang removal process uses a halide of the metal of the liner layer as etchant. Besides the halide of the metal of the liner layer, other etchant or chemicals, e.g., dry etching gas such as $Cl_2$ or $BCl_3$, wet etching chemicals such as SPM, SC1, or SC2, or combinations thereof, may also be used as the etchant. The halide/etchant reacts with the metal of the liner layer without substantially attacking the oxide of the metal of the liner layer, or a silicide region comprising the metal. As a result, the etching process can easily remove its constituent metal and leave behind the nitrided, oxidized, carbonized or alloyed liner layer, thus forming a self-limiting liner layer for subsequent processing, and no extra patterning is used. The disclosed methods can be used to reduce or remove overhang in metal seed layers or adhesion layers formed by a variety of deposition techniques such as PVD, plasma enhanced CVD (PE-CVD), or plasma enhanced atomic layer deposition (PE-ALD).

In some embodiments, a method includes forming a recess in a dielectric layer, the recess defining first sidewalls of the dielectric layer. The method also includes depositing a first conductive layer over an upper surface of the dielectric layer and the sidewalls of the dielectric layer, the first conductive layer having a first overhang, removing the first overhang of the first conductive layer using an etchant selected from the group consisting of a halide of the first conductive layer, $Cl_2$, $BCl_3$, SPM, SC1, SC2, and combinations thereof, and filling the recess with a second conductive layer.

In other embodiments, a method includes forming an opening in a dielectric layer over a substrate, the opening extending from a top surface of the dielectric layer into the dielectric layer, forming a first metal layer over the top surface of the dielectric layer, and over sidewalls of the dielectric layer exposed by the opening, the first metal layer having an overhang. The method further includes etching the first metal layer using an etchant comprising a halide of the first metal layer, the etching removing the overhang, and filling the opening using a second metal layer.

In yet other embodiments, a method includes providing a substrate with a dielectric layer overlying the substrate and an opening in the dielectric layer, a bottom of the opening exposing a semiconductor region. The method also includes forming a first metal layer lining sidewalls of the dielectric layer exposed by the opening, a top surface of the dielectric layer, and a top surface of the semiconductor region, where the first metal layer has an overhang, and where a portion of the first metal layer lining the top surface of the semiconductor region forms a first region with a portion of the semiconductor region, the first region including a silicide region or a germano-silicide region. The method further includes performing an etching process to remove the overhang using an etchant selected from the group consisting of a halide of the first metal layer, $Cl_2$, $BCl_3$, SPM, SC1, SC2, and combinations thereof, the etching process removing the first metal layer and leaving the first region substantially intact, and forming a second metal layer in the opening, the second metal layer extending from the bottom of the opening to the top surface of the dielectric layer without a void.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  forming a recess in a dielectric layer, the recess defining first sidewalls of the dielectric layer;
  depositing a first metal to form a first conductive layer over an upper surface of the dielectric layer and the first sidewalls of the dielectric layer, the first conductive layer having a first overhang, wherein the depositing the first metal further forms a first oxide layer between the first conductive layer and the dielectric layer, the first oxide layer being an oxide of the first metal;

removing portions of the first conductive layer along the first overhang of the first conductive layer using an etchant comprising a halide of the first metal, wherein the removing leaves portions of the first oxide layer along the first overhang of the first conductive layer; and filling the recess with a second conductive layer.

2. The method of claim 1, wherein the second conductive layer fills the recess without a void.

3. The method of claim 1, wherein the first overhang is proximate to a corner between the upper surface of the dielectric layer and the first sidewalls of the dielectric layer.

4. The method of claim 1, wherein the first metal is selected from the group consisting of Ti, Ta, W, Al, Co, Hf, Ru, and Zr, and wherein the removing comprises removing the first overhang using an etching gas comprising $H_2$, Ar, and the halide of the first metal.

5. The method of claim 4, wherein the first conductive layer is a seed layer, wherein the method further comprises forming a diffusion barrier layer over the upper surface of the dielectric layer and the first sidewalls of the dielectric layer before the depositing, wherein the diffusion barrier layer is formed between the dielectric layer and the seed layer.

6. The method of claim 4, where the removing and the depositing are performed in a same processing chamber.

7. The method of claim 4, wherein the first metal comprises Ti, and the etching gas comprises $TiCl_4$.

8. The method of claim 4, further comprising forming a seed layer over the first conductive layer before the filling the recess with a second conductive layer.

9. The method of claim 8, wherein the seed layer has a second overhang, wherein the method further comprises removing the second overhang of the seed layer using a halide of a second metal of the seed layer.

10. The method of claim 4, wherein the forming the recess exposes a first region comprising a semiconductor material or a metal at a bottom of the recess, wherein a top portion of the first region reacts with the deposited first metal layer to form a second region comprising a silicide region, a germano-silicide region, or a metal alloyed region.

11. The method of claim 10, wherein the removing removes the first conductive layer without substantially attacking the second region.

12. The method of claim 11, further comprising after the removing and before the filling:
performing a treatment of the first conductive layer;
performing an anneal process; and
performing a reduction process, the reduction process reducing an oxide formed during the anneal process.

13. A method comprising:
forming an opening in a dielectric layer over a substrate, the opening extending from a top surface of the dielectric layer into the dielectric layer;
forming a first metal layer over the top surface of the dielectric layer, and over sidewalls of the dielectric layer exposed by the opening, the first metal layer having an overhang, wherein the forming the first metal layer forms an oxide of the first metal layer contacting the dielectric layer;
etching the first metal layer using an etchant comprising a halide of the first metal layer, the etching removing the overhang, wherein the etching removes the first metal layer and leaves at least a portion of the oxide of the first metal layer; and
filling the opening using a second metal layer.

14. The method of claim 13, wherein the etching further removes the first metal layer disposed over the sidewalls of the dielectric layer.

15. The method of claim 13, wherein the first metal layer comprises Ti, and the etchant is part of an etching gas comprising $TiCl_4$, $H_2$, and Ar.

16. The method of claim 13, wherein the forming the first metal layer forms a first region at a bottom of the opening, the first region comprising a silicide region, a germano-silicide region, or a metal alloyed region, the first region being between the first metal layer and a second region underlying the opening, the second region comprising a semiconductor region or a metallization region, wherein the etching removes the first metal layer without substantially removing the first region.

17. A method comprising:
providing a substrate with a dielectric layer overlying the substrate and an opening in the dielectric layer, a bottom of the opening exposing a semiconductor region;
depositing a first metal layer on sidewalls of the dielectric layer exposed by the opening, a top surface of the dielectric layer, and a top surface of the semiconductor region, wherein the first metal layer has an overhang, wherein a first portion of the first metal layer lining the top surface of the semiconductor region forms a first region with a portion of the semiconductor region, the first region comprising a silicide region or a germano-silicide region, and wherein a second portion of the first metal layer lining the sidewalls and the top surface of the dielectric layer forms a second region with the dielectric layer, the second region comprising an inner layer and an outer layer, the inner layer being an oxide of the first metal layer, the outer layer being the first metal layer;
performing an etching process to remove the overhang using an etchant comprising a halide of the first metal layer, the etching process removing the first portion of the first metal layer and the outer layer of the second portion of the first metal layer, the etching process leaving the first region and the inner layer of the second portion of the first metal layer substantially intact; and
forming a second metal layer in the opening, the second metal layer extending from the bottom of the opening to the top surface of the dielectric layer without a void.

18. The method of claim 17, further comprising performing a treatment using $NH_3$ to nitride the first metal layer after the performing the etching process.

19. The method of claim 18, further comprising:
performing a thermal anneal process after the treatment using $NH_3$; and
performing a reduction process after the thermal anneal process.

20. The method of claim 18, wherein the first metal layer comprises Ti, the halide of the first metal layer comprises $TiCl_4$, and the etching process is performed with an etching gas comprising the etchant, $H_2$, and Ar.

* * * * *